(12) United States Patent
Miller

(10) Patent No.: US 6,882,239 B2
(45) Date of Patent: Apr. 19, 2005

(54) ELECTROMAGNETICALLY COUPLED INTERCONNECT SYSTEM

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 83 days.

(21) Appl. No.: 09/851,566

(22) Filed: May 8, 2001

(65) Prior Publication Data

US 2002/0186106 A1 Dec. 12, 2002

(51) Int. Cl.[7] ............................... H01P 5/02; H01P 5/18
(52) U.S. Cl. ...................... 333/24 R; 333/109; 333/247
(58) Field of Search ............................. 333/247, 24 R, 333/116, 109; 257/728, 664

(56) References Cited

U.S. PATENT DOCUMENTS

| | | |
|---|---|---|
| 3,619,504 A | 11/1971 | DeVeer |
| 4,901,041 A | 2/1990 | Pengelly |
| 5,023,993 A | 6/1991 | Fengelly |
| 5,138,436 A | 8/1992 | Koepf .......................... 357/74 |
| 5,237,663 A | 8/1993 | Srinivasan |
| 5,251,235 A | 10/1993 | Henoch |
| 5,311,122 A | 5/1994 | Fullerton et al. |
| 5,365,205 A | 11/1994 | Wong |
| 5,389,890 A * | 2/1995 | Burrage .................. 333/109 X |
| 5,396,650 A | 3/1995 | Terauchi |
| 5,432,486 A * | 7/1995 | Wong ....................... 333/24 R |
| 5,452,291 A | 9/1995 | Eisenhandler et al. |
| 5,528,203 A | 6/1996 | Mohwinkel et al. |
| 5,592,480 A | 1/1997 | Carney et al. |
| 5,608,606 A | 3/1997 | Blaney |
| 5,638,402 A | 6/1997 | Osaka et al. |
| 5,717,725 A | 2/1998 | Campana, Jr. |
| 5,719,860 A | 2/1998 | Maison et al. |
| 5,739,665 A | 4/1998 | Bares |
| 5,751,820 A | 5/1998 | Tainzer |
| 5,771,462 A | 6/1998 | Olsen |
| 5,793,359 A | 8/1998 | Ushikubo |
| 5,815,732 A | 9/1998 | Cooper et al. |
| 5,853,020 A | 12/1998 | Widner |
| 5,867,688 A | 2/1999 | Simmon et al. |
| 5,890,015 A | 3/1999 | Garney et al. |
| 5,894,425 A | 4/1999 | Saliba |
| 5,894,474 A | 4/1999 | Maison et al. |
| 5,913,174 A | 6/1999 | Casarez et al. |
| 5,917,388 A | 6/1999 | Tronche et al. ............. 333/246 |
| 5,930,725 A | 7/1999 | Kornby |
| 5,940,384 A | 8/1999 | Carney et al. |
| 5,983,100 A | 11/1999 | Johansson et al. |
| 6,003,072 A | 12/1999 | Gerritsen et al. |
| 6,011,785 A | 1/2000 | Carney et al. |
| 6,111,476 A * | 8/2000 | Williamson .................. 333/109 |
| 6,139,364 A | 10/2000 | Beutler et al. |
| 6,215,454 B1 | 4/2001 | Tran |
| 6,356,173 B1 * | 3/2002 | Nagata et al. .............. 333/247 |
| 6,449,308 B1 | 9/2002 | Knight, Jr. et al. |
| 6,559,531 B1 | 5/2003 | Sutherland |
| 6,600,325 B1 | 7/2003 | Coates et al. |
| 2002/0057137 A1 | 5/2002 | Marketkar et al. ........ 333/24 R |

OTHER PUBLICATIONS

Chang et al., "RF/Wireless Interconnect for Inter- and Intra–Chip Communications," Proceedings of the IEEE, vol. 89 No. 4, (Apr. 2001), pp. 456–466.

* cited by examiner

Primary Examiner—Benny Lee
(74) Attorney, Agent, or Firm—N. Kenneth Burraston

(57) ABSTRACT

An electromagnetic interconnect method and apparatus effects contactless, proximity connections between elements in an electronics system. Data to be communicated between elements in an electronic system are modulated into a carrier signal and transmitted contactlessly by electromagnetic coupling. The electromagnetic coupling may be directly between elements in the system or through an intermediary transmission medium.

41 Claims, 8 Drawing Sheets

ELECTROMAGNETICALLY COUPLED INTERCONNECT SYSTEM

BACKGROUND OF THE INVENTION

1. Field of the Invention

The present invention relates in general to an electromagnetic contactless interconnect scheme for providing a communication path between electronic components, such as integrated circuits, and/or electrical systems and, in particular, to an electrical interconnect scheme in which the electronic elements are electromagnetically coupled to each other either directly or through an intermediate device, by contactless proximity connections.

2. Description of Related Art

Integrated circuits and other elements of an electronics system typically communicate with one another through a wired interconnection structure. For example, in a data processing or computing system, a parallel wired interface, such as a bus, may link a microprocessor to other integrated circuits, such as memory integrated circuits, within the system. To communicate with one another, all of the integrated circuits and other electronic elements of the system must be physically connected, with a direct current (DC) path, to the wired interconnection structure. In other words, the integrated circuits and other electronics elements must make physical contact with the wired interconnection structure. Thereafter, the integrated circuits and other system elements can send electronic signals to each other over the wired interconnection structure.

Generally, only one integrated circuit or system element sends signals on the wired interconnection structure at any given time, but all integrated circuits and system elements typically monitor each signal traveling on the wired interconnection structure. Usually, an integrated circuit or system element ignores data conveyed on the wired interconnection structure unless the data is addressed to that integrated circuit or system element.

In a typical wired interconnection structure, each wired signal line is usually implemented by a separate trace on a printed circuit board or the like. Drivers and receivers within each integrated circuit or system element transmit and receive signals conveyed on each line of the wired interconnection structure. The drivers and receivers do so by physically contacting the lines and thereby creating an electrical connection with the lines. Such prior methods, however, have several disadvantages: they are costly, they consume power, they can distort and attenuate high frequency signals, and they often require large, capacitive electrostatic discharge (ESD) protection devices. In many high frequency applications, the signal distortion caused by the wired interconnection structure, rather than the speed of the integrated circuits or system elements themselves, often limits the speed or data rate at which the integrated circuits and system elements are able communicate with each other.

BRIEF SUMMARY OF THE INVENTION

The present invention is directed to a method and apparatus for effecting contactless, proximity connections between elements in an electronics system.

In one embodiment, a plurality of electronic components, such as integrated circuits, are electromagnetically coupled to a transmission line. A first electronic component modulates data to be sent to another electronic component. The modulated data signal is communicated from the first electronic component to the transmission line and then from the transmission line to the other electronic component by electromagnetic coupling, obviating the need for physical contact between either electronic component and the transmission line. In other embodiments, electronic components, such as integrated circuits, are electromagnetically coupled to each other directly, obviating the need for an intermediary, such as a transmission line.

DETAILED DESCRIPTION OF THE INVENTION

The present invention is directed to a method and apparatus for effecting contactless, proximity connections between elements in an electronics system. (As used herein, "contactless" refers to a lack of a direct physical or mechanical contact through which electrons can flow, i.e., "contactless" means that direct electrical contact between conductors is not required.) The following describes exemplary embodiments of the invention. The invention, however, is not limited to the following exemplary embodiments or to the manner in which the exemplary embodiments operate or are described herein.

Figure 1:
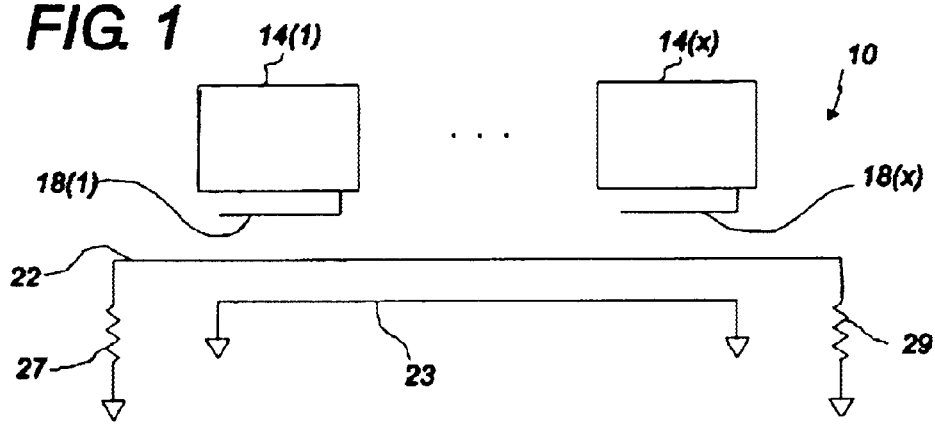
FIG. 1 illustrates an exemplary embodiment of the invention in which integrated circuits are electromagnetically coupled to a transmission line.
Figure 2:
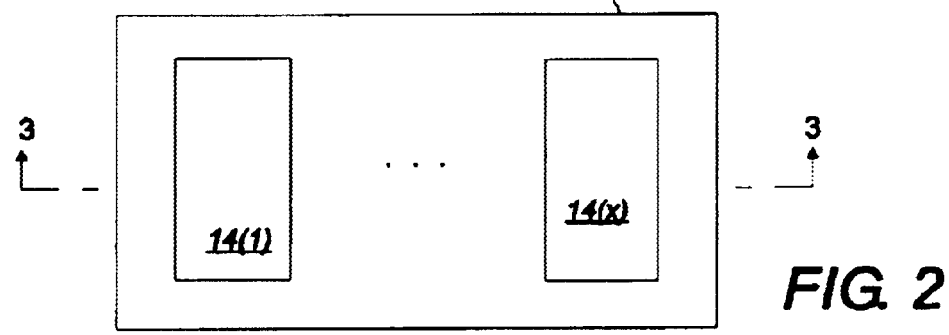
FIG. 2 is a plan view illustrating the integrated circuits of FIG. 1 on a printed circuit board.
Figure 3:
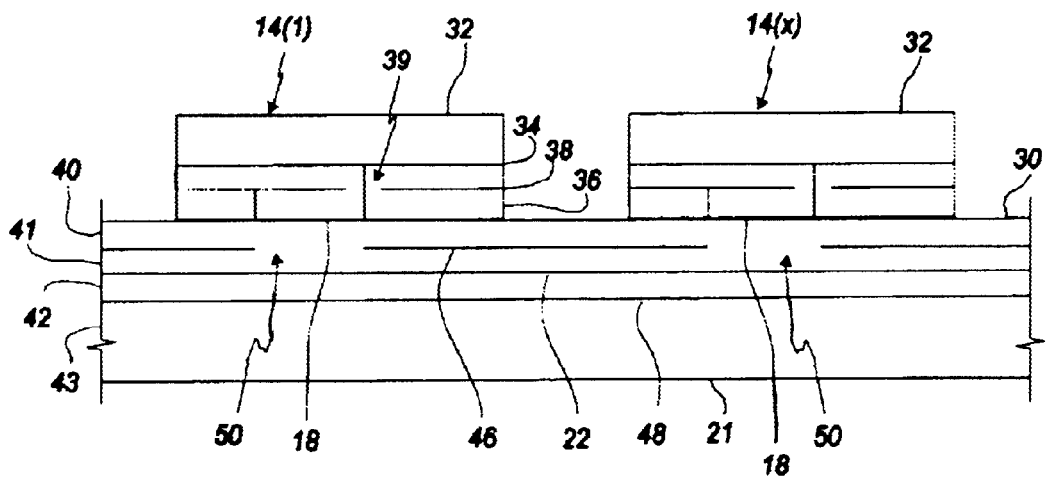
FIG. 3 is a partial, cross-sectional view of the integrated circuits and printed circuit board of FIG. 2.

FIGS. 1 through 4 illustrate an exemplary embodiment of the invention. As shown in FIG. 1, an electronics system 10 includes a plurality of integrated circuits 14(1)–14(x) and a transmission line 22. As shown in FIG. 1, a transmission line typically includes return line 23. As illustrated in FIGS. 2 and 3, the integrated circuits 14(1)–14(x) are mounted on a printed circuit board 21, and the transmission line 22 is embedded in the printed circuit board. Alternatively, transmission line 22 may be located on a surface of the printed circuit board 21. As illustrated in FIG. 1, the transmission line 22 is preferably terminated in its characteristic impedance 27, 29 to reduce or eliminate reflections.

Figure 4:
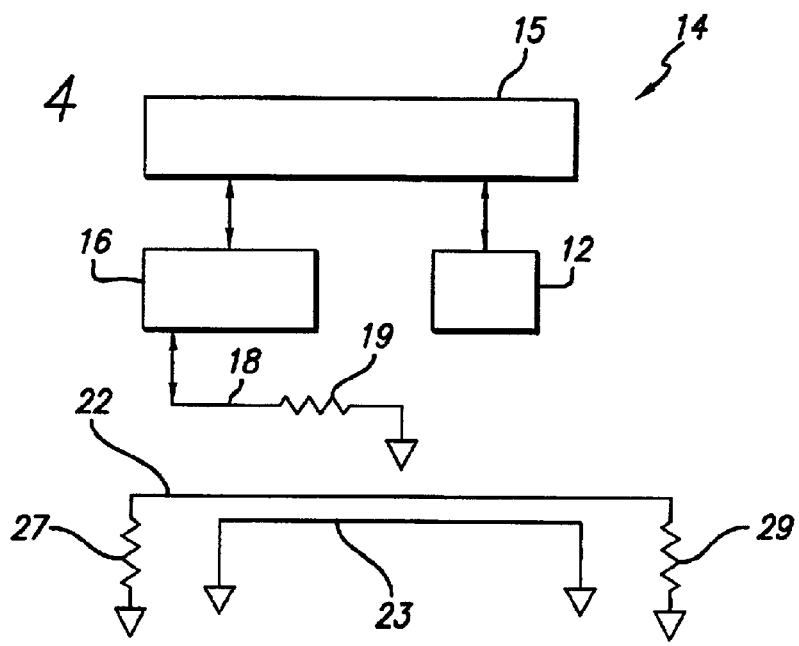
FIG. 4 illustrates a block diagram of an exemplary integrated circuit that may correspond to an integrated circuit (eg., 14(1)) of FIG. 1.

Integrated circuits 14(1)–14(x) may be any type of integrated circuit or electronic circuit. For example, one or more of integrated circuits 14(1)–14(x) may be without limitation a memory device, a microprocessor, a microcontroller, a digital logic device, an analog device, or any combination of the foregoing. FIG. 4 illustrates a block diagram of an exemplary integrated circuit 14 that may be used with the present invention. Although not part of integrated circuit 14, transmission line 22 is also shown in FIG. 4 for clarity and discussion purposes.

As shown in FIG. 4, integrated circuit 14 may include a logic circuit 12 that implements the function of the integrated circuit. Integrated circuit 14 may also include an input/output interface 15 for controlling input and output of signals to and from the logic circuit 12. Such signals may be any type of analog or digital signals. For example, in a data processing or computing system, the signals may include, without limitation, data signals, address signals, control signals, timing signals, clock signals, and the like. As used herein, the terms "data" and "signals" are intended to include all such signals.

Each integrated circuit 14 may also include a radio frequency (RF) transceiver 16 and a small electromagnetic coupler 18. Preferably, the electromagnetic coupler is sufficiently small that it can be formed on or within the integrated circuit using standard semiconductor fabrication techniques. Alternatively, the electromagnetic coupler 18 could be fabricated as part of the semiconductor package. Thus, the electromagnetic coupler is preferably smaller than a typical semiconductor die. In the embodiment illustrated in FIGS. 1–4, input/output interface 15 preferably provides a serial interface to the transceiver 16, and transceiver 16 encodes the data received from input/output interface 15 using any suitable RF modulation scheme. (See FIG. 4.) Nonexclusive examples of suitable RE modulation schemes include amplitude modulation (AM), frequency modulation (FM), phase code modulation (PCM), phase modulation (PM), or any combination of the foregoing. It is believed that modulation schemes used in modem technology may be particularly advantageous in the present invention. However, the specific design of the transceiver and the specific modulation scheme are not critical to the invention, and any suitable transceiver and modulation scheme may be used with the present invention.

Transceiver 16 provides the modulated signal to electromagnetic coupler 18. Electromagnetic coupler 18 is preferably formed on or as part of the integrated circuit 14. As shown in FIG. 4, one end of the electromagnetic coupler 18 is preferably grounded but may be alternatively terminated with impedance 19 to obtain desired directional coupling, power, or distortion characteristics. Furthermore, the electromagnetic coupler 18 may be terminated or connected to a reference voltage other than ground or open-circuited.

Electromagnetic coupler 18 is disposed in proximity to transmission line 22 so as to be electromagnetically coupled to transmission line 22. Preferably, electromagnetic couplers 18 are disposed within approximately ten millimeters of the transmission line 22. The invention is not limited, however, to placement of any electromagnetic coupler 18 within ten millimeters of the transmission line 22. Transmission line 22 is typically embedded in or located on printed circuit board 21. Because electromagnetic coupler 18 is electromagnetically coupled to transmission line 22, the modulated signal provided to electromagnetic coupler 18 by transceiver 16 induces a similar but attenuated signal in the transmission line. A contactless communication path or channel is thus provided between integrated circuit 14 and transmission line 22.

The transmission line 22 may be any type of transmission line including without limitation a microstrip line, a strip line, a twisted pair, a coaxial cable, a wire over ground, a waveguide, or any combination, hybrid, or modification of the foregoing. The specific design or implementation of the transmission line 22 is not critical to the invention, and indeed, any structure capable of being electromagnetically coupled with an electromagnetic coupler 18 and conducting or channeling a received signal may function as a transmission line 22 in the present invention.

Regardless of its specific implementation, the transmission line 22 is preferably embedded within a printed circuit board 21. However, the transmission line may be formed on or otherwise mounted to provide an interconnect channel between electromagnetically coupled circuits. As mentioned above, in order to prevent or minimize reflections, the transmission line 22 is preferably terminated at one or both ends in its characteristic impedance 27, 29 (see. e.g., FIGS. 1 and 4).

The printed circuit board 21 is preferably a typical printed circuit board as commonly used in the electronics field. The design and composition of the printed circuit board 21, however, is not critical to the invention and may be any substrate capable of supporting electronic components and on which or within which transmission lines or conductors can be attached or formed.

As shown in FIG. 1 and other figures. modulated signals induced on transmission line 22 by the electromagnetic coupler 18(1) of one integrated circuit 14(1) may be detected by another integrated circuit 14(x) in the system 10. That is, the modulated signal in transmission line 22 induces a similar but attenuated signal in the electromagnetic coupler 18(x) of the other integrated circuit or circuits 14(x) whose electromagnetic couplers 18(x) are disposed in proximity to the transmission line 22 so as to be electromagnetically coupled to the transmission line.

Assuming that the integrated circuit is configured as illustrated in FIG. 4, a modulated signal sensed by an electromagnetic coupler 18 is decoded (demodulated) by transceiver 16. The decoded data is then provided to input/output bus 15, which provides the data to logic circuit 12.

It should be noted that coupling between an electromagnetic coupler 18 and transmission line 22 can optionally be made directional by terminating the grounded end of the electromagnetic coupler 18 in the characteristic impedance 19 of the electromagnetic coupler, as illustrated in FIG. 4. Then, depending on which end of electromagnetic coupler 18 is terminated to ground (with the characteristic impedance 19 as shown in FIG. 4) and which end is connected to transceiver 16, electromagnetic coupler 18 can induce an RF signal traveling only in one direction along transmission line 22 and can receive an RF signal traveling only in the opposite direction along transmission line 22.

For example, an electromagnetic wave traveling on transmission line 22 such that its wave front first passes the grounded end of coupler 18 and thereafter passes the end of coupler 18 connected to transceiver 16 will generate a signal in coupler 18 that is detected by transceiver 16. On the other hand, an electromagnetic wave traveling in the opposite direction along transmission line 22 will generate a wave in coupler 18 that is dissipated by impedance 19; transceiver 16 will not detect such a wave.

If impedance 19 is not present (e.g., coupler 18 is grounded or open-circuited), the wave generated in coupler 18 would reflect off of the end of coupler 18 back into transceiver 16. Thus, without impedance 19, waves traveling in either direction on transmission line 22 are detected by transceiver 16.

Regardless of whether impedance 19 is present, electromagnetic waves generated by the transmitter portion of transceiver 16 will propagate along coupler 18 from the transceiver to the grounded end of the coupler. The wave propagating along coupler 18 will cause a wave to be generated in transmission line 22 in the same direction. If impedance 19 is not present, the wave in coupler 19 will reflect off of the grounded end of coupler 18 and propagate back toward transceiver 16. The reflected wave will generate a wave in transmission line 22 in the same direction as the reflected wave. Thus, without impedance 19, waves will be generated in transmission line 22 in both directions.

If, however, impedance 19 is present, the initial wave generated by coupler 18 will not reflect along coupler 18 back toward transceiver 16. Rather, the initial wave will be dissipated by impedance 19. In such a case, a wave is generated in transmission line 22 in only one direction. Thus, if impedance 19 is present, the transmitter portion of transceiver 16 will create waves in transmission line 22 in only one direction.

Directional coupling between couplers 18(1), 18(2), 18(3), 18(4), 18(5), 18(6), 18(7), and 18(8) and transmission line 22, as discussed above, may be advantageous when, for example, the logic circuit 12 of integrated circuit 14(1) is a microprocessor, and the logic circuits 12 of the other integrated circuit or circuits (e.g., 14(2), 14(3), 14(4), 14(5), 14(6), 14(7), and/or 14(8)) are memories or other devices that communicate with the microprocessor but not with one another. An example of such a case is discussed below with respect to FIG. 5. In such a case, the electromagnetic coupler 18(1) of integrated circuit 14(1) may be oriented to transmit signals to the right on transmission line 22 and to receive signals traveling to the left on transmission line 22. The electromagnetic couplers 18(2), 18(3), 18(4), 18(5), 18(6), 14(7), and/or 18(8) of integrated circuit or circuits 14(2), 14(3), 14(4), 14(5), 14(6), 14(7), and/or 14(8) would be oriented to transmit signal to the left and to receive signals transmitted to the right. Such directional coupling can limit the load drawn by integrated circuit or circuits 14(2), 14(3), 14(4), 14(5), 14(6), 14(7), and/or 14(8) when any one of those integrated circuits is transmitting to integrated circuit 14(1). Of course, coupling between an electromagnetic coupler (eg., 18(1), 18(2), 18(3), 18(4), 18(5), 18(6), 18(7), and/or 18(8)) and transmission line 22 can be made bi-directional by simply leaving electromagnetic coupler (e.g., 18(1), 18(2), 18(3), 18(4), 18(5), 18(6), 18(7), and/or 18(8)) open circuited or grounded.

Figure 6A:
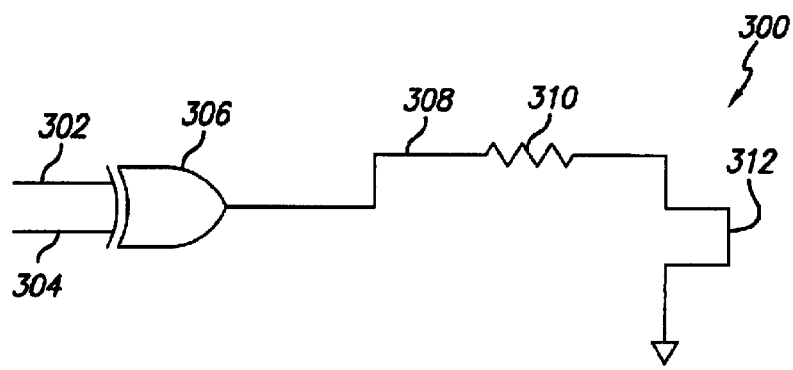
FIGS. 6a and 6b illustrate exemplary transmitter and receiver circuits that may correspond to the transceiver 16 in FIG. 4.
Figure 6B:
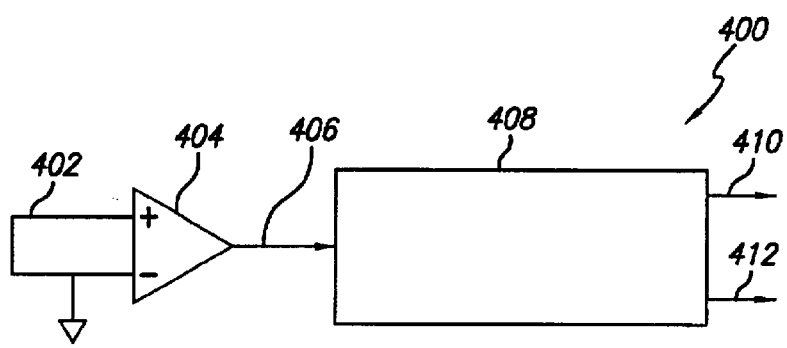

A simple, exemplary transceiver circuit is illustrated in FIGS. 6a and 6b. FIG. 6a illustrates an exemplary transmitter 300 portion of the circuit, and FIG. 6b illustrates an exemplary receiver 400 portion of the circuit. Data to be transmitted is input at terminal 302 of XOR gate 306. (See FIG. 6a.) A square wave carrier signal is input at terminal 304 of XOR gate 306. The square wave carrier signal may be a system clock signal. The output 308 of XOR gate 306 is a bipolar phase shift keying (BPSK) modulated signal containing both the data and the clock to be transmitted. Resistor 310 controls the amount of current that will flow through coupling loop 312. Coupling loop 312 radiates electromagnetic energy corresponding to the modulated signal, which, as discussed above, induces a similar but attenuated modulated signal in any other coupling loop or transmission line that is electromagnetically coupled to coupling loop 312.

In the exemplary receiver circuit 400 illustrated in FIG. 6b, an attenuated modulated signal is generated in coupling loop 402 by transmission of the modulated signal by any other coupling loop or transmission line electromagnetically coupled to coupling loop 402. The modulated signal is amplified by amplifier 404. The amplified, modulated signal 406 is demodulated by bit synchronizer 408. If bit synchronizer 408 requires a phase-locked-loop circuit, it may be feasible to use the phase-locked-loop circuit that is typically found in most integrated circuits. Bit synchronizer 408 outputs demodulated data and clock signals from the modulated signal at output 410. In addition, if a system clock signal was used by a transmitter to modulate the transmitted signal, the bit synchronizer clock output may also be used as a system clock signal at output 412. Other bit synchronizer clock recovery schemes may be used including without limitation delay lock loops and early-late discriminators.

It should be stressed that the above described transceiver design is exemplary only. The specific design of the transceiver is not critical to the invention, and any suitable transceiver may be used with the invention.

Thus, in accordance with the above described embodiment of the invention, two or more integrated circuits in system 10 may communicate with each other without requiring a direct electrical contact of conductors. All or part of the path between an electromagnetic coupler 18 on a first integrated circuit 14(1) and the electromagnetic coupler 18 an another integrated circuit 14(x) may be referred to as a contactless communication channel or path.

Figure 5:
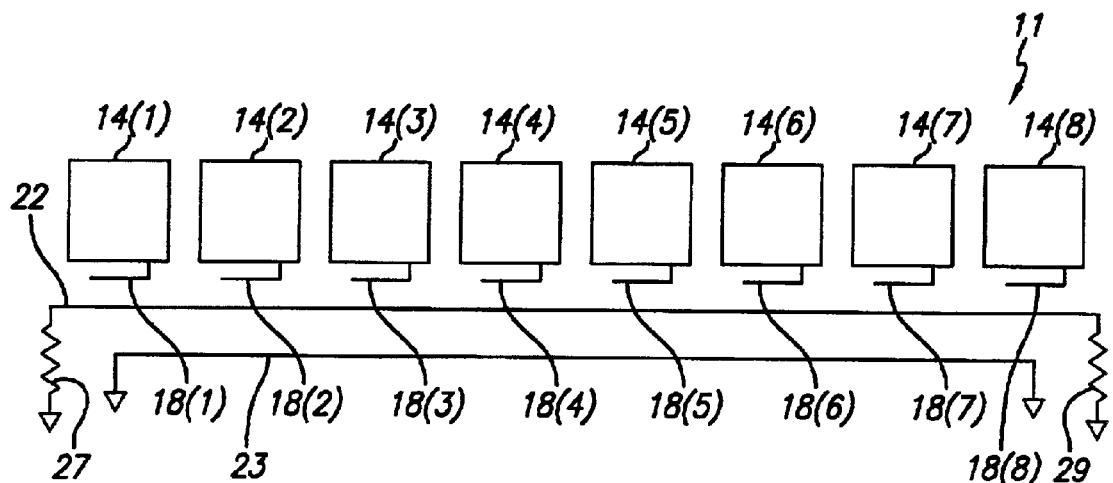
FIG. 5 illustrates an exemplary embodiment of the invention in which eight integrated circuits are electromagnetically coupled to a transmission line.

FIG. 5 illustrates an exemplary electronics system 11 in which eight integrated circuits 14(1), 14(2), 14(3), 14(4), 14(4), 14(5), 14(6), 14(7), and 14(8) are electromagnetically coupled to transmission line 22. For example, the eight integrated circuits may be a microprocessor 14(1) and seven memory devices 14(2), 14(3), 14(4), 14(5), 14(6), 14(7), and 14(8). The eight integrated circuits 14(1), 14(2), 14(3), 14(4), 14(4), 14(5), 14(6), 14(7), and 14(8) are mounted on a printed circuit board (not shown in FIG. 5). Each of the electromagnetic couplers 18(1), 18(2), 18(3), 18(4), 18(4), 18(5), 18(6), 18(7), and 18(8) are electromagnetically coupled to transmission line 22. The system 11 may be partially or fully shielded. Exemplary shielding configurations are described more fully below.

An exemplary manner in which system 11 may operate is as follows. In this example, integrated circuit 14(1), a microprocessor, wishes to write data to integrated circuit 14(4), in this example, a memory device. To do so, integrated circuit 14(1) modulates the following: the data to be written to the memory, a write command code, and an address identifying both the memory device 14(4) and the location within memory device 14(4) to which the data is to be written into a carrier signal. Because electromagnetic coupler 18(1) is electromagnetically coupled to transmission line 22, the modulated signal in electromagnetic coupler 18(1) generates a similar, though attenuated signal, on the transmission line, which in turn generates a similar, though still further attenuated, signal in each of the electromagnetic couplers 18(2) through 18(8). In this manner, each of the other integrated circuits 14(2) through 14(8), all memory devices in this example, receives the data, write command, and the address transmitted by microprocessor 14(1). Because the address identifies memory device 14(4) as the intended recipient of the transmission, only memory device 14(4) keeps and processes the data. Of course, if the system implementation requires higher data rates than a single channel can support, a multiplicity of transmission lines and channels can be utilized.

Although not required in the present invention, shielding materials may be disposed in electronics system 10 so as to partially or completely shield the contactless communication channels or paths shown in FIGS. 1–3 and described above.

For example, as illustrated in FIGS. 2 and 3, a shielding plane 38 may shield the circuitry on the integrated circuit 14 from the electromagnetic coupler 18. (FIG. 2 is a plan view of the plurality of integrated circuits 14(1)–14(x) of FIG. 1 mounted on an upper surface of printed circuit board 21, and FIG. 3 is a partial sectional elevation view of the printed circuit board 21 and integrated circuits 14(1) and 14(x) of FIG. 2.) As shown in FIG. 3, the active circuit elements of the integrated circuit (e.g., the logic circuit 12, the input/output interface 15, and the transceiver 16 illustrated in FIG. 4) are fabricated on a die 32 that includes a semiconductor substrate and various metalization and insulating layers formed thereon.

A shielding plane 38 is disposed between the circuitry on the die and the electromagnetic coupler 18. The shielding plane may be any type of conductive material suitable for absorbing or blocking electromagnetic signals. Insulating layers 34 and 36 may be formed on the die 32 surrounding the shielding plane 38. In the exemplary embodiment of FIG. 3, a via 39 in shielding plane 38 is provided for electrically connecting active circuitry on the integrated circuit 14 (e.g., transceiver 16 of FIG. 4) with electromagnetic coupler 18. Although not required by the present invention, the shielding plane 38 may be grounded and may supply connections to ground to the electromagnetic coupler 16 or the integrated circuit 14. Alternatively, the shielding plane 38 may be electrically connected to a voltage supply and provide power or a reference voltage to integrated circuit 14.

One or more shielding planes may also be provided in or on the printed circuit board 21. For example, a shielding plane 46 may be embedded in or formed on printed circuit board 21 between the transmission line 22 and the integrated circuit 14. As illustrated in the exemplary embodiment of FIG. 3, one or more gaps or "windows" 50 in the shielding plane 46 allow electromagnetic coupling through gap(s) 50 between the electromagnetic coupler 18 and the transmission line 22. Again, the shielding plane 46 may be connected to ground, a reference voltage, or power and used to provide ground connections, a reference voltage, or power to the printed circuit board 21 or the integrated circuit 14. Shielding plane 38 may also act as a lid or cover for the gaps 50 that prevent radiation from either the coupling loop 18 or the transmission line 22 from affecting circuitry on the die.

Another shielding plane 48 may be provided within or on the printed circuit board 21 such that the transmission line 22 is disposed between the shielding plane 46 and the shielding plane 48. Again, these shielding planes 46, 48 may be connected to ground, a reference voltage, or power and used to provide ground connections, the reference voltage, or power to the printed circuit board 21 or the integrated circuit 14. As shown in FIG. 3, insulating layers, such as layers 40, 41, 42, and 43, may also be included in or on the printed circuit board 21.

Thus, the above described shielding planes partially shield communication paths from an electromagnetic coupler 18 on one integrated circuit 14 to the electromagnetic coupler 18 on another integrated circuit. Additional shielding planes, traces, or wires may be disposed around the communication path to more completely shield the communication path. For example, additional shielding could be provided around transmission line 22 to more complete shield the transmission line. In addition, shielding material may be disposed around electronics system 10 itself to fully or partially "close" the entire system.

Circuitry composing the transceiver may be fabricated on the integrated circuit using standard semiconductor fabrication techniques. That is, it may simply be designed and fabricated as another piece of the overall circuitry composing the integrated circuit. Electromagnetic couplers and shielding planes may likewise be fabricated on or within the integrated circuit using standard semiconductor fabrication techniques.

Many multiplexing, data exchange, and communication schemes and protocols are known in the electronics fields, and any such scheme or schemes or combination thereof may be used with the above described embodiment for transmitting data between integrated circuits. For example, known multiplexing schemes include, without limitation, time division multiplexing, frequency division multiplexing, and code division multiplexing. Exemplary, known protocols include, without limitation, Scalable Coherent Interface (SCI), Fire Wire, Ethernet, and Universal Serial Bus. Again, any such multiplexing scheme or protocol or combination thereof may be used with the instant invention.

As is known, the amount of attenuation that occurs between a signal in an electromagnetic coupler 18 and the corresponding signal generated in the transmission line 22 (or between a signal in the transmission line 22 and the corresponding signal generated in the electromagnetic coupler 18) can be readily designed into any variation of the embodiment of the invention described above. The following is a nonexclusive list of parameters that affect the amount of attenuation: the proximity of the electromagnetic coupler 18 to the transmission line 22; the physical orientation of the electromagnetic coupler 18 to the transmission line 22; the length of the electromagnetic coupler 18 relative to the wavelength of the carrier signal; the shapes of the electromagnetic coupler 18 and the transmission line 22. Using these and other parameters affecting coupling known to persons skilled in the field, the attenuation of signals wirelessly passed between the electromagnetic couplers 18 and the transmission line 22 can be preselected and designed into the system 10.

It should be noted, however, that when electromagnetic couplers 18 of a large number of integrated circuits 14 are tightly coupled (that is, coupled so as to reduce substantially the amount of attenuation) to a transmission line 22, each electromagnetic coupler draws a substantial amount of power from the RF signal as it travels along transmission line 22 and the RF signal can become severely attenuated by the time it reaches an integrated circuit at the end of transmission line 22. In such a case, it is preferable to design electromagnetic couplers 18 to be less tightly coupled to transmission line 22 so that they do not draw substantially more power than needed to permit an incoming RF signal to be properly detected by transceivers 16. Thus, generally speaking, loose coupling is preferred over tight coupling, particularly in systems where many devices share a common channel. However, in systems where only a small number of devices are coupled together, tighter coupling may be desired to reduce attenuation between devices and reduce undesirable radiation. For example, tighter coupling may be appropriate in systems having eight or fewer electronic devices electromagnetically coupled to a transmission line.

Table I below summarizes three link budget analysis applicable over a broad range of operating conditions for the embodiment illustrated in FIG. 3 above, given the following coupling, particularly in systems where many devices share a common channel. However, in systems where only a small number of devices are coupled together, tighter coupling may be desired to reduce attenuation between devices and reduce undesirable radiation. For example, tighter coupling may be appropriate in systems having eight or fewer electronic devices electromagnetically coupled to a transmission line.

Table I below summarizes three link budget analysis applicable over a broad range of operating conditions for the embodiment illustrated in FIG. 3 above, given the following exemplary parameters. A carrier frequency in the range of 1–10 GHz is assumed, and electromagnetic couplers 18 are about 2–3 millimeters long and about 50 microns above shielding plane 46. Insulating layers 36 and 38 together are about 25 microns thick. Transmission line 22 is about 150 micron wide, spaced about 150 microns from shielding planes 46 and 48. It should be stressed that the above dimensions are exemplary only and given as the framework setting for the below described exemplary link budget analyses. The invention is not limited in any way to the above described dimensions or the below described operating ranges.

Exemplary case #1 through case #3 of table I represent decreasing system cost and complexity at the expense of decreasing data rate performance.

The Noise power Ni in milliwatts is given by the formula:

$Ni = 1000 \, k \, Te \, B$,

Where:

$k = 1.38 \times 10^{-23}$ Joules/Degree (Boltzmann's constant)

$Te = (F-1) To$ $To = 370 \, K (100 \text{ degrees C.})$

F = Noise Figure of Receiver

B = Frequency bandwidth in Hz

Therefore the available signal bandwidth for a given Signal to Noise Ratio (SNR) can be computed in dBm from:

$Ni(dBm) = 10 \log [1000 \, k \, Te \, B]$

Solving for B:

$B = 10^{\wedge}(Ni(dBm)/10)/[1000 \, k \, Te]$ 0.3 bits/Hz is the approximate bandwidth required for a bipolar phase shift keying (BPSK) digital modulation scheme in a modest implementation. More complex modulation schemes and circuitry are capable of yielding higher bits/Hz densities. Likewise, spread spectrum techniques can yield lower bit/Hz densities while yielding lower bit error rates at lower SNR ratios at the expense of additional system complexity.

Exemplary case # 1 represents a link budget where the system transmitter voltage (e.g., transceiver 16 of FIG. 4) is 2.4 volts peak-to-peak into a 50 ohm (+11.6 dBm), an 18 dB transmitting electromagnetic coupler 18 loss is used, the receiving electromagnetic coupler 18 has an additional 18 dB loss, and the Printed Circuit Board (PCB) and other system losses total 6 dB. In this case the desired link margin is 10 dB and the desired signal to noise ratio (SNR) is 25 dB. A conservative receiver implementation noise figure of 8 dB is assumed. Hence, the available noise bandwidth is over 10 GHz, corresponding to a 3 Giga-bit/second (Gb/sec) data rate at 0.3 bit per Hz of bandwidth. In this case, the signal level power would not necessarily be a limiting factor of the implementation.

Exemplary case # 2 represents a link budget where the transmitter voltage is reduced 6 dB to 1.2 volts peak-to-peak into a 50 ohms (+5.5 dBm), along with a more lossy 22 dB transmitting electromagnetic coupler 18, together with the receiving electromagnetic coupler 18 has, representing an additional 22 dB loss. The link margin of case # 2 has been decreased to a still conservative value of 8 dB. The noise figure of the receiver implementation has been increased to 9 dB. This system would represent a more economical system to implement than the system illustrated by case #1. In case #2, the available noise bandwidth is 1.6 GHz, corresponding to a 480 Mb/second (Mb/sec) data rate assuming 0.3 bit per Hz of bandwidth.

Exemplary case #3 further reduces the transmitter voltage to 0.63 volts peak-to-peak (0 dBm) and further increases system implementation losses and reduces the link margin of the systems illustrated in Cases #1 and #2 above. Case #3 is representative of an even lower cost implementation that nonetheless supports a 81 Mb/sec data channel.

Together, exemplary cases #1 through #3 represent a broad range of operating conditions for various transmitter levels, receiver implementations and signal bandwidths. Many operating conditions outside the range of values of Table I could be implemented by those skilled in the art.

TABLE I

|  | Units | Case # 1 | Case # 2 | Case # 3 |
| --- | --- | --- | --- | --- |
| Voltage output of transmitter | volts p-p | 2.4 | 1.2 | 0.63 |
| RMS voltage = Vp-p/2.88 | volts rms | 0.83 | 0.42 | 0.22 |
| Transmitter output (milliwatts into 50 ohms) | dBm | 11.6 | 5.5 | 0.0 |
| Outgoing Coupling Loss | dB | 18 | 22 | 26 |

TABLE I-continued

|  | Units | Case # 1 | Case # 2 | Case # 3 |
|---|---|---|---|---|
| Incoming Coupling Loss | dB | 18 | 22 | 26 |
| PCB and other System Losses | dB | 6 | 6 | 6 |
| RF Signal power at receiver | dBm | −30 | −44 | −58 |
| Desired link margin | dB | 10 | 8 | 6 |
| Desired SNR | dB | 25 | 20 | 15 |
| Noise power budget | dBm | −65 | −72 | −79 |
| Noise Figure Of receiver | dB | 8 | 9 | 10 |
| Noise Figure Of receiver (F) | ratio | 6 | 8 | 10 |
| Equivalent Noise Temperature Te = (F-1) × 370 | degree K | 1965 | 2569 | 3330 |
| Available signal Bandwidth | Hz | 10.6E+9 | 1.6E+9 | 270.8E+6 |
| Bit Rate at 0.3 bit/Hz [BPSK] | Mb/Sec | 3,168 | 481 | 81 |

Figure 7:
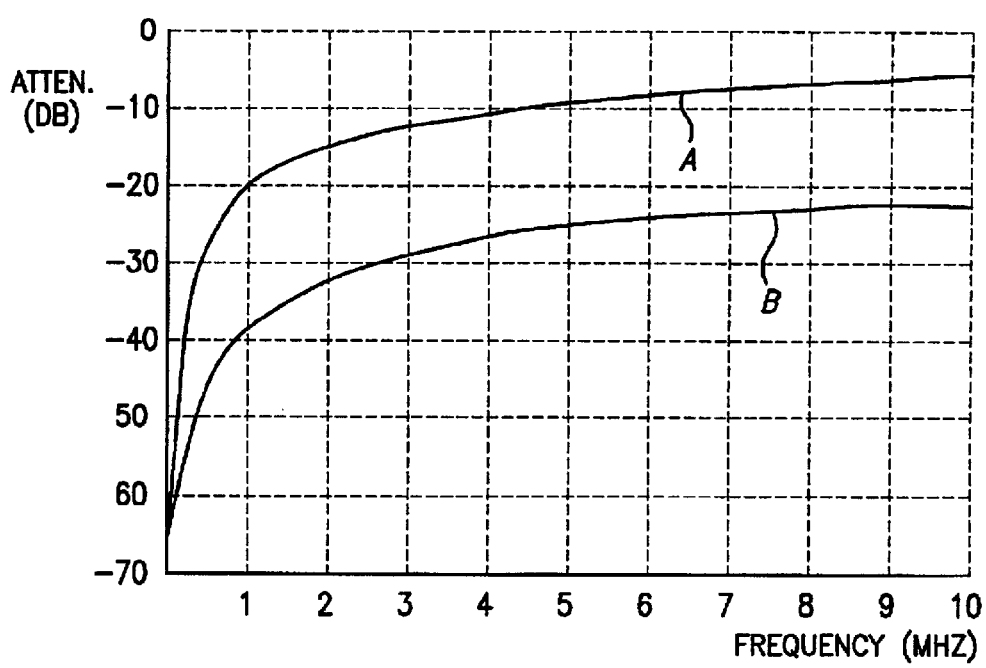
FIG. 7 illustrates exemplary coupling characteristic data for an exemplary embodiment of the invention.

FIG. 7 depicts the electromagnetic coupling attenuation in dB between two 2.5 mm, 50 ohm microstrip traces over a shielding plane that is grounded. One trace, representing an electromagnetic coupler 18 of the above described embodiment, is driven with a signal generator (e.g., transceiver 16 of FIG. 4) having an output impedance of 50 ohms and terminated with a 50 ohm resistor. The other trace, representing transmission line 22 in the above described embodiment, is terminated at both ends with 50 ohms of impedance. The spacing between the two microstrips is 0.05 mm (plot A) or 0.4 mm apart (plot B). Microstrip modeling was used for conservative and easy to model estimates of coupling; actual coupling values achievable with the broadside structures of this invention will yield less attenuation and/or smaller structures.

Again, it must be stressed that the above dimensions are exemplary only and given as a framework for the sample data present in FIG. 7. The invention is not limited in any way to the above described dimensions or the sample data presented in FIG. 7.

Figure 8:
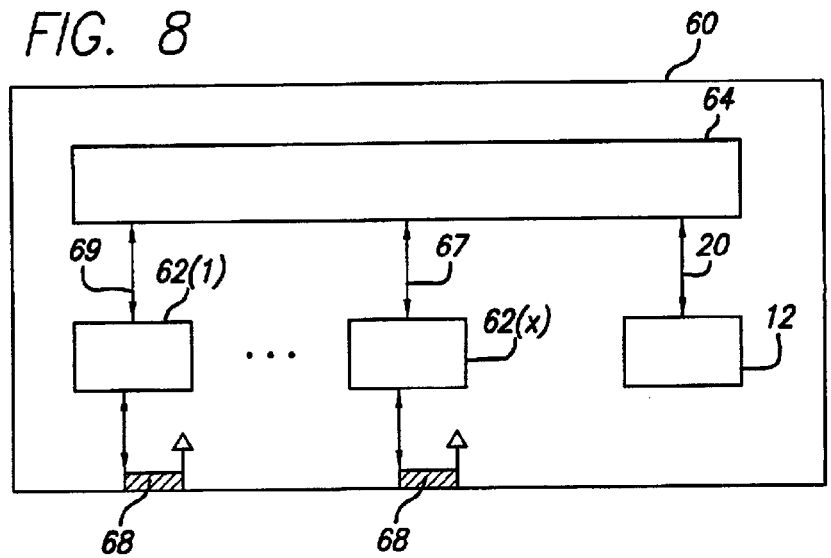
FIG. 8 illustrates a block diagram of an exemplary integrated circuit that may correspond to an integrated circuit that may be used with a plurality of contactless interconnects of the invention.
Figure 9:
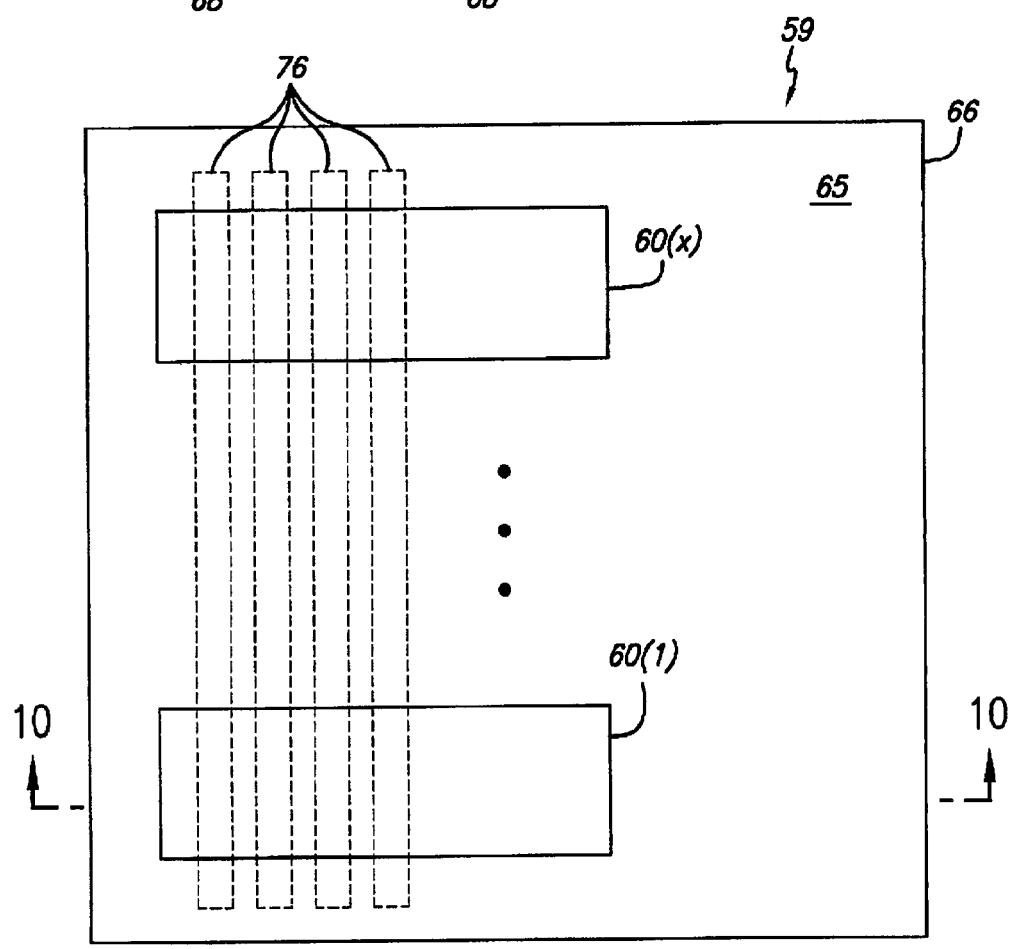
FIG. 9 illustrates an exemplary embodiment of the invention in which a plurality of integrated circuits are each electromagnetically coupled to a plurality of transmission lines.
Figure 10:
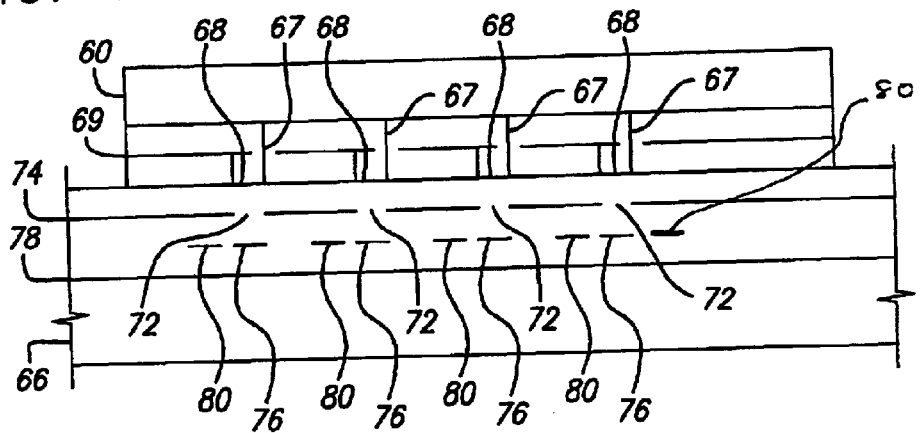
FIG. 10 is a cross-sectional view from FIG. 9.

FIGS. 8–10 illustrate an alternative embodiment of an integrated circuit that may be used in electronics system 10. As shown in FIG. 8, unlike the integrated circuit illustrated in FIG. 4 which includes only one transceiver, integrated circuit 60 includes a plurality of transceivers 62(1)–62(x), each of which may be similar to the transceiver 16 illustrated in FIG. 4. Like integrated circuit 14 in FIG. 4, integrated circuit 60 may also include a logic circuit 12 and an input/output interface 64.

Generally speaking, integrated circuit 60 may be utilized in electronics system 10 in any manner that integrated circuit 14 of FIG. 4 is utilized. Integrated circuit 60, however, may be contactlessly coupled to as many transmission lines as it has transceivers 62.

FIGS. 9 and 10 illustrate an exemplary configuration of an electronics system 59 in which a plurality of integrated circuits 60(1)–60(x) each have four transceivers 62(1)–62(x). The plurality of integrated circuits 60(1)–60(x) are mounted on a surface 65 of a printed circuit board 66. Embedded within the printed circuit board (and shown in dashed-outline form in FIG. 9) are four transmission lines 76. As discussed above, the transmission lines 76 may alternatively be formed on the printed circuit board 66. Each of the four electromagnetic couplers 68 (see FIG. 10) on each of the plurality of integrated circuits 60(1)–60(x) is coupled to one of the transmission lines 76. Preferably, each of electromagnetic couplers 68 (see FIG. 10) are disposed within approximately five millimeters of the its corresponding transmission line 76. The invention is not limited, however, to placement of any electromagnetic coupler 68 (see FIG. 10) within five millimeters of a transmission line 76. In this manner, transmission lines 76 form a four-path, bus-like structure in which the plurality of integrated circuits 60(1)–60(x) can contactlessly communicate with each other over the bus-like structure.

As described above, the contactless communication paths in electronics system 59 of FIGS. 9 and 10 may optionally be fully or partially shielded. FIG. 10 illustrates exemplary partial shielding of the electronics system 59 illustrated in FIG. 9. As shown in FIG. 10, a shielding plane 69 shields the circuitry on integrated circuit 60 from the four electromagnetic couplers 68 of integrated circuit 60. Each of the four transceivers 62 in integrated circuit 60 are electrically connected to an electromagnetic coupler 68 on the integrated circuit 60 through vias 67 extending though separate gaps in a shielding plane 69. Additional shielding may be provided by shielding planes or traces 80 disposed between transmission lines 76, and still further shielding may be provided by shielding planes 74 and 78, between which transmission lines 76 are located as illustrated in FIG. 10. If shielding plane 74 is included, gaps 72 in shielding plane 74 between each electromagnetic coupler 68 and each transmission line 76 are included in shielding plane 74. Integrated circuit 60 can then be positioned on printed circuit board 66 so that its electromagnetic couplers 68 are electromagnetically coupled to the transmission lines 76 through the gaps 72.

As with the embodiment illustrated in FIGS. 1–4 above, one or more of the shielding planes may be grounded and may supply ground connections to the integrated circuits 60 or the printed circuit board 66. Similarly, one or more of the shielding planes my be connected to a power supply and supply power or a reference voltage to the integrated circuits 60 or the printed circuit board 66.

Figure 11:
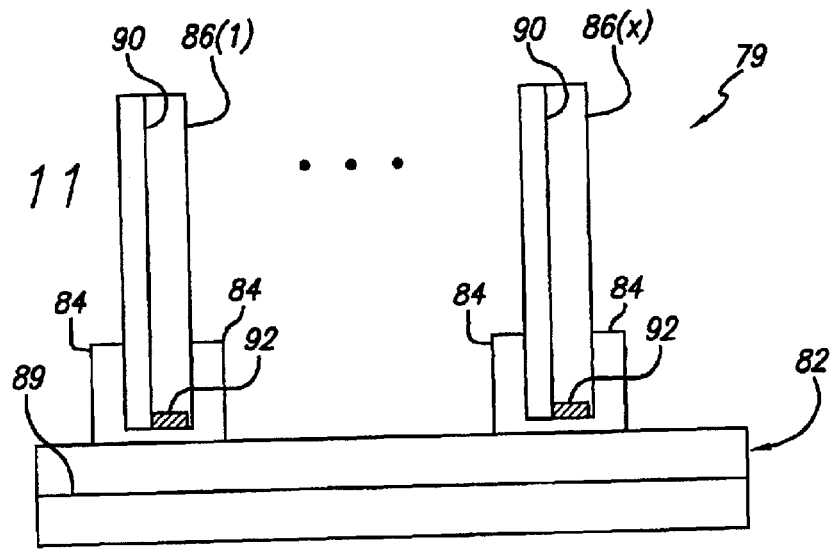
FIG. 11 is a cross-sectional, side view of an embodiment of the invention in which daughter cards are electromagnetically coupled to a mother board.

Although the embodiments of the invention described above contactlessly transmit data between integrated circuits, the present invention is not limited to the contactless transmission of signals between integrated circuits. FIG. 11 illustrates an exemplary embodiment of an electronics system 79 in which signals are contactlessly transmitted between elements of an electronic system other than integrated circuits, namely, a daughter board and a mother board.

As shown in FIG. 11, a plurality of daughter boards 86(1)–86(x) are physically mounted to a mother board 82. Conventional edge connectors 84 may be used to mount the daughter boards 86(1)–86(x) to the mother board 82. Each daughter card 86 includes a transmission line 90 embedded within or located on the daughter card 86. Motherboard 82 also includes a transmission line 89, which preferably is embedded in the mother board but may alternatively be located on the mother board. The transmission lines 90 of the daughter boards 86 are electrically connected to electromagnetic couplers 92, which, when the daughter boards 86 are mounted to the mother board 82, are positioned in proximity to the transmission line 89 in the mother board 82 such that the electromagnetic couplers 92 of the daughter boards 86 are electromagnetically coupled to the transmission line 89 of the mother board 82. Preferably, an electromagnetic coupler 92 is disposed within approximately five millimeters of its corresponding transmission line 90. The invention is not limited, however, to placement of any electromagnetic coupler 92 within five millimeters of a transmission line 89. In this manner, daughter boards 86 can contactlessly communicate with mother board 86.

Figure 12:
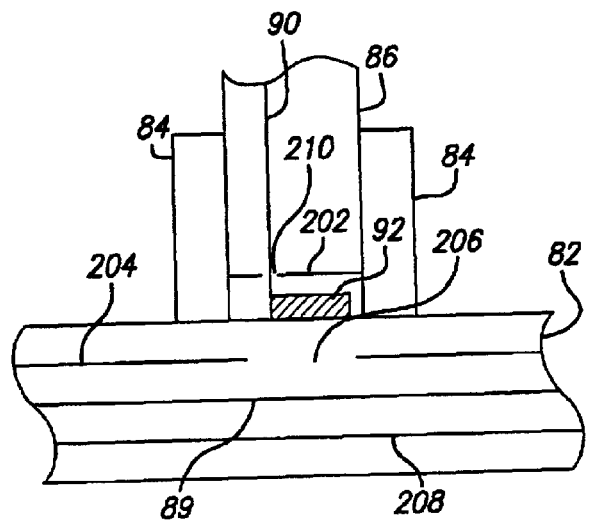
FIG. 12 is a detailed cross-sectional view of the connector elements of FIG. 11.

The contactless communications paths illustrated in FIG. 11 may optionally be partially or fully shielded. FIG. 12 shows a partial, sectional view of a daughter board 86 and mother board 82 and illustrates exemplary shielding that may be utilized to partially shield the embodiment illustrated in FIG. 11. As shown in FIG. 12, a shielding plane or shielding via 202 may be disposed within daughter board 86 to shield the daughter card from electromagnetic coupler 92. The amount of shielding, of course, depends, among other things, on the degree to which the electromagnetic coupler 92 is surrounded by shielding material and thereby electromagnetically isolated from other elements on the daughter board 86. As with other embodiments described herein, persons skilled in the field will thus be able to adjust the degree by which daughter card 86 is shielded from electromagnetic coupler 92 by selective placement of shielding planes or materials around electromagnetic coupler 92. In the example illustrated in FIG. 12, shielding plane 202 includes a gap 210 through which transmission line 90 is electrically connected to electromagnetic coupler 92.

Transmission line 89 in mother board 82 may also be shielded. As shown in FIG. 12, transmission line 89 may be disposed between shielding planes 204 and 208. As also shown, shielding plane 204 includes a gap 206 in proximity to electromagnetic coupler 92, allowing for a contactless communication path through the gap between electromagnetic coupler 92 and transmission line 89. Transmission line 89 may be more fully shielded by including additional shielding planes that more fully enclose the transmission line. For example, additional shielding planes may be included in front of the transmission line 89 and behind the transmission line (from the perspective of FIG. 12). As discussed above, the shielding planes may be connected to power or ground to provide power or reference signals to the mother board 82 or daughter board 86.

Daughter boards 86 may include integrated circuits or other system elements that are electromagnetically coupled to transmission line 90 in accordance with the principles of the present invention. For example, daughter boards 86 may include configurations as described above with respect to FIGS. 1–10. Alternatively, daughter boards 86 may include integrated circuits or other system elements that are conventionally coupled via contact connections to transmission line 90. Of course, daughter boards 86 may include multiple traces 90, and the connections between each such trace and system elements on the daughter cards may include a combination of contactless connections and conventional contact connections.

Figure 13:
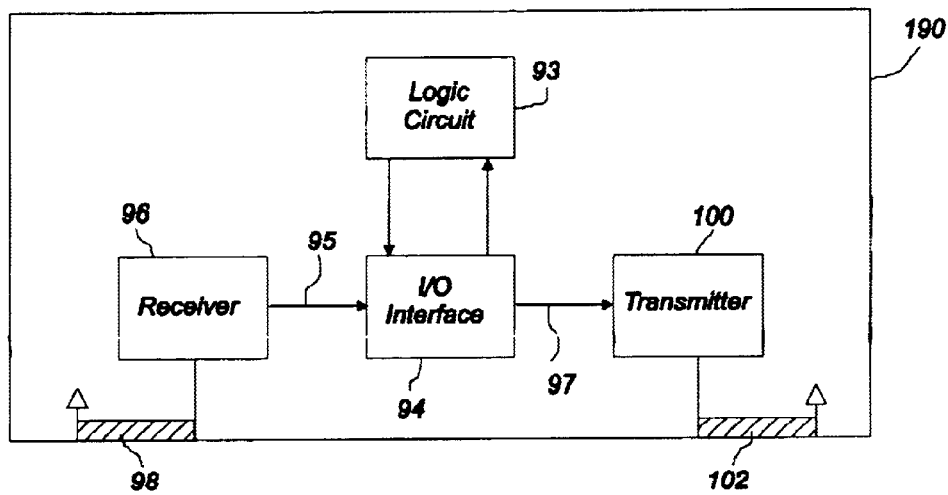
FIG. 13 illustrates an exemplary integrated circuit that may be used in the embodiment of the invention illustrated in FIG. 14.
Figure 14:
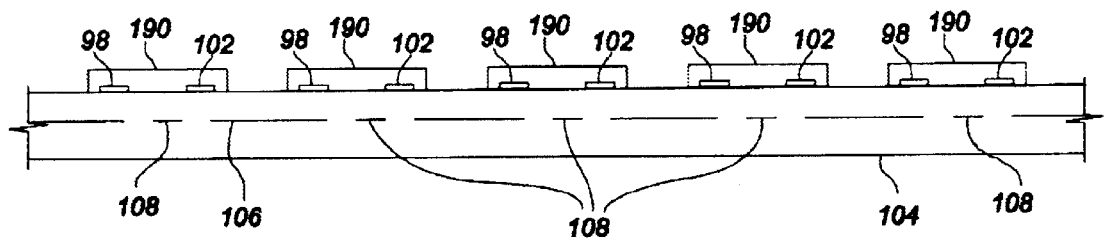
FIG. 14 illustrates a cross-sectional view of an exemplary embodiment of the invention in which a plurality of integrated circuits are electromagnetically coupled to a ring bus structure.

It should be noted that the present invention does not require that transmission lines be arranged into any particular bus structure. FIGS. 13 and 14 illustrate an exemplary embodiment of the invention that utilizes a daisy-chain or ring type bus arrangement.

As shown in FIG. 13, an integrated circuit 190 may be configured with a transmitting coupler 102 and a separate receiving coupler 98 adapted for communicating through an electromagnetically coupled ring or token ring bus. Integrated circuit 190 may also include a logic circuit 93 communicating via an input/output interface 94. A receiver 96 demodulates an RF signal arriving on electromagnetic coupler 98 to produce an input signal 95 to input/output (I/O) interface 94. Typically, the input signal 95 conveys data transmitted by another element that is electromagnetically coupled to the ring bus. If the data is addressed to integrated circuit 90, input/output interface 94 passes the data to logic circuit 93. Otherwise input/output interface 94 encodes the data into an output signal 97 and passes it to transmitter 100. Transmitter 100 supplies an RF signal modulated by the output signal 97 to an electromagnetic coupler 102.

Input/output interface 94 also encodes any data originating from logic circuit 93 to be sent to another element on the ring bus. Input/output interface 94 encodes the data along with the address of the intended recipient of the data and delivers an encoded output signal 97 to transmitter 100, which transmits the encoded signal onto the ring bus.

FIG. 14 is a simplified cross-sectional view of a printed circuit board 104 holding several integrated circuits 90 similar to integrated circuit 90 of FIG. 13. Separate short traces 106 embedded in or located on the printed circuit board 104 electromagnetically couple pairs of couplers 98 and 102 on adjacent integrated circuits 90. Shielding such as that discussed above with respect to other embodiments of the invention may also be included. For example, a shielding plane 108 may shield traces 106 from one another. Although not shown in FIG. 14, printed circuit board 90 may also include shielding planes above and below traces 108, and integrated circuit 90 may include a shielding plane above electromagnetic couplers 98 and 102 and below the circuits implemented on the substrate of integrated circuit 90 to provide shielding.

Although the above-described embodiments of the invention utilize a transmission line as an intermediary bus-like structure in communications between integrated circuits, the present invention is not limited to contactless transmissions involving a transmission line or any type of bus arrangement.

Figure 15:
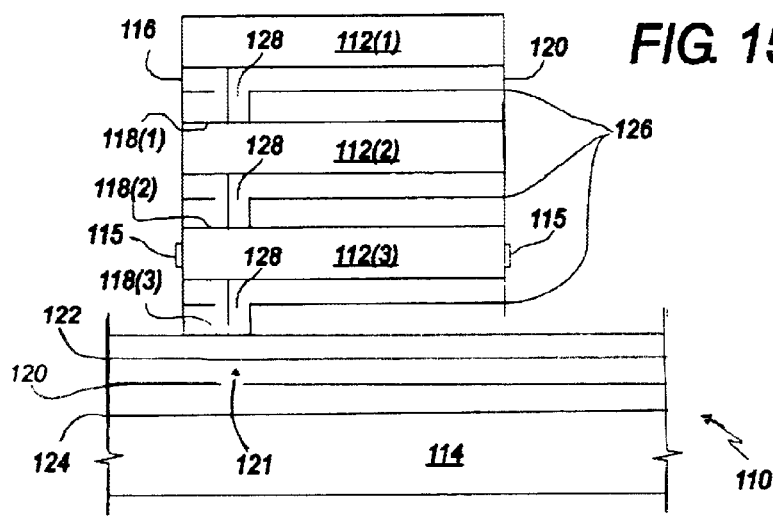
FIG. 15 illustrates a cross-sectional view of an exemplary embodiment of the invention in which a plurality of stacked integrated circuits are electromagnetically coupled.
Figure 16:
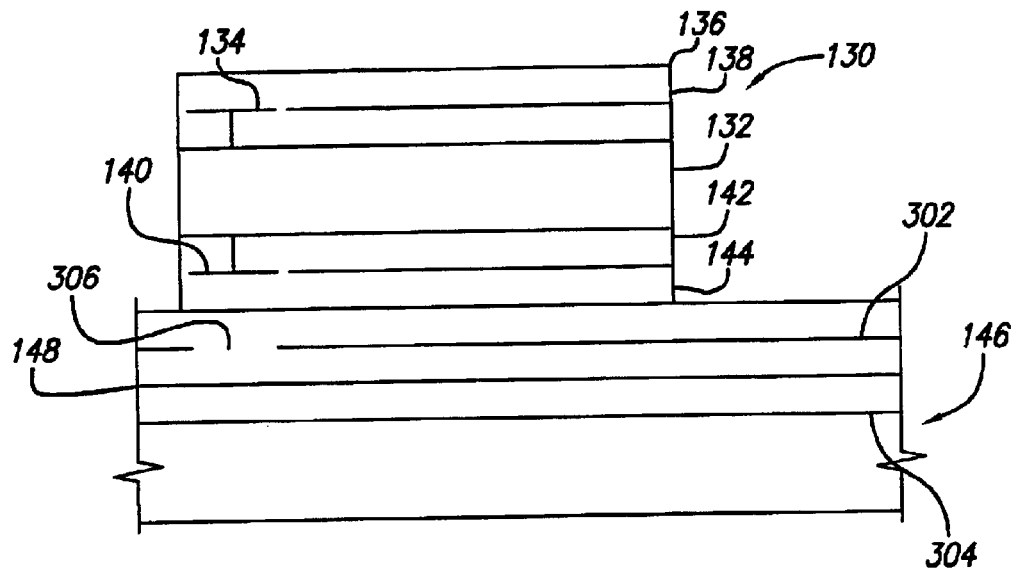
FIG. 16 illustrates an exemplary embodiment of the invention in which dual sides of an integrated circuit are electromagnetically coupled.

FIGS. 15–16 illustrate an exemplary embodiment of the invention in which integrated circuits contactlessly communicate directly with each other. As shown in FIG. 15 (a cross-sectional side view), a plurality (in this example three) of integrated circuits 112(1), 112(2), and 112(3) are vertically stacked. For example integrated circuit 112(3) might include a computer processor and integrated circuits 112(1) and 112(2) might implement memories the processor accesses. Each integrated circuit 112(1), 112(2), and 112(3) includes a substrate 116 in which is formed circuitry. For example, the circuitry might include a logic circuit, an input/output interface, and a transceiver or transceivers configured in an arrangement similar to that of integrated circuit 14 of FIG. 4, integrated circuit 60 of FIG. 8, or integrated circuit 190 of FIG. 13. The transceiver in each integrated circuit 112(1), 112(2), and 112(3) is connected to a corresponding electromagnetic coupler 118(1), 118(2), and 118(3), which is preferably formed on or within substrate 116. Electromagnetic couplers 118(1), 118(2), and 118(3) are located in proximity with each other so as to be electromagnetically coupled with one another. In this manner, integrated circuits 112(1), 112(2), and 112(3) communicate with each other contactlessly through the silicon without requiring vias or conductive vertical elements to interconnect the stacked dice.

Integrated circuits 112(1)–112(3) can be disposed such that each electromagnetic coupler 118(1), 118(2), and 118(3)

is electromagnetically coupled to all of the other electromagnetic couplers. Alternatively, the couplers 118(1), 118 (2), and 118(3) of integrated circuits 112(1), 112(2), and 112(3) may be tuned and "tightly" coupled to act as resonant transformers to pass RF signals vertically in either direction between electromagnetic coupler 118(1) and 118(3) of integrated circuits 112(1), 112(2), and 112(3) without attenuation. In such arrangements, a transmission by one integrated circuit (e.g., 118(1)) would be received and decoded by all of the other integrated circuits. Only the integrated circuit to which the transmission was addressed, however, would keep and process the data in the transmission.

Alternatively, each integrated circuit 112(1), 112(2), and 112(3) could be disposed (and or shielded) such that its electromagnetic coupler 118(1), 118(2), and 118(3) is electromagnetically coupled only to the electromagnetic coupler of the integrated circuit immediately above and/or below. A communications protocol such as that described above with respect to FIGS. 13 and 14 could be used. For example, upon receiving a transmission from a neighbor, an integrated circuit (eg., 118(2)) decodes the destination address of the transmission. If the transmission is addressed to the integrated circuit, the integrated circuit decodes and processes the data in the transmission. If, however, the transmission is not addressed to the integrated circuit, the integrated circuit forwards the transmission to its other neighbor.

Optional shielding may be included. For example, shielding planes 126 may be included in integrated circuits 118 (1)–118(3) to shield the circuitry in each integrated circuit from electromagnetic couplers 118(1)–118(3). If such shielding planes 126 are included, gaps 128 in the planes should be included between electromagnetic couplers 118 (1)–118(3). Additional shielding may be included in accordance with the shielding principles discussed above to provide more complete shielding.

As illustrated in FIG. 15, the stacked integrated circuits 112(1)–112(3) may optionally be mounted on a printed circuit board 114. The stacked integrated circuits 112(1)–112 (3) may make conventional physical contact type electrical connections with printed circuit board 114. Alternatively, the stacked integrated circuits 112(1)–112(3) may communicate contactlessly with the printed circuit board 114. Such an arrangement is illustrated in FIG. 15. There the integrated circuit 112(3) communicates contactlessly with the printed circuit board 114, and the printed circuit board includes optional shielding in accordance with the shielding principles discussed above. As also illustrated in FIG. 15. power and ground connectors 115 may be included to provide power, ground, and reference voltage connections to the integrated circuits 112(1), 112(2), 112(3).

As shown, printed circuit board 114, which may be similar to printed circuit board 21 of FIG. 3, includes a trace 120 disposed between two shielding planes 122 and 124. The trace 120 may convey a radio frequency signal to other electronic elements on the printed circuit board 114. Examples of other circuit elements include without limitation other integrated circuits or other stacks of integrated circuits. The electromagnetic coupler 118(3) of integrated circuit 112(3) resides in proximity to a gap 121 in optional shielding plane 122 so that coupler 118(3) is electromagnetically coupled to trace 120. In accordance with the shielding principles discussed above, additional shielding planes or materials may be included to more fully shield trace 120 and the contactless communication path between electromagnetic coupler 118(3) and trace 120.

FIG. 16 illustrates an exemplary embodiment in which one portion of an integrated circuit 130 communicates contactlessly with another portion of the integrated circuit. As illustrated, an integrated circuit 130 has circuits formed on both top and bottom surfaces of its semiconductor substrate 132. The circuits may include logic circuits, input/output interface circuits, and a radio frequency transceivers in arrangements similar to that of integrated circuit 14 of FIG. 4, integrated circuit 60 of FIG. 8, or integrated circuit 90 of FIG. 13. An electromagnetic coupler 134 is associated with circuitry on one side of the substrate 132, and a second electromagnetic coupler 140 is associated with circuitry on the other side of the substrate. In this manner, couplers 134 and 140 are electromagnetically coupled so that the circuitry on one side of the substrate 132 can contactlessly communicate with circuitry on the other side of the substrate.

Full or partial shielding may optionally be included in the embodiment illustrated in FIG. 15. For example, shielding planes 138 and 144 may be appropriately disposed to shield the integrated circuits on both sides of the substrate 132 from the couplers 134, 140. Additional shielding may be included in accordance with the principles discussed above to more fully shield the integrated circuits from the couplers 134, 140. Gaps are provided in the shielding as needed to allow couplers 134 and 140 to couple electromagnetically to each other.

As with the "stacked" integrated circuit embodiment illustrated in FIG. 15 above, the dual-sided embodiment illustrated in FIG. 16 may be mounted on a printed circuit board 146. As discussed above with regard to FIG. 15, conventional physical contact structures may be used to communicate with the printed circuit board 146, or contactlessly coupling in accordance with the instant invention may be used. FIG. 16 illustrates the latter with optional shielding planes 302, 304 for shielding transmission line 148. Gap 306 is provided in shielding plane 302 to allow coupler 140 to couple to transmission line 148. As discussed above, additional shielding could be added to more fully shield trace 148.

Although not shown in FIG. 16, power and ground connectors (such as 115 in FIG. 15) may be included to provide power, ground, and reference voltage connections to the integrated circuit 130. In addition, multiple integrated circuits similar to integrated circuit 130 (with circuitry integrated into both sides of a substrate) may be stacked as shown in FIG. 15.

Of course, two or more integrated circuits each having an electromagnetic coupler may simply be disposed such that their electromagnetic couplers are in sufficient proximity that they are electromagnetically coupled to each other. Preferably, electromagnetic couplers that are electromagnetically coupled to each other are disposed within approximately twenty-five millimeters of each other. The invention is not limited, however, to placement of any electromagnetic coupler within twenty-five millimeters of any other electromagnetic coupler.

Figure 17A:
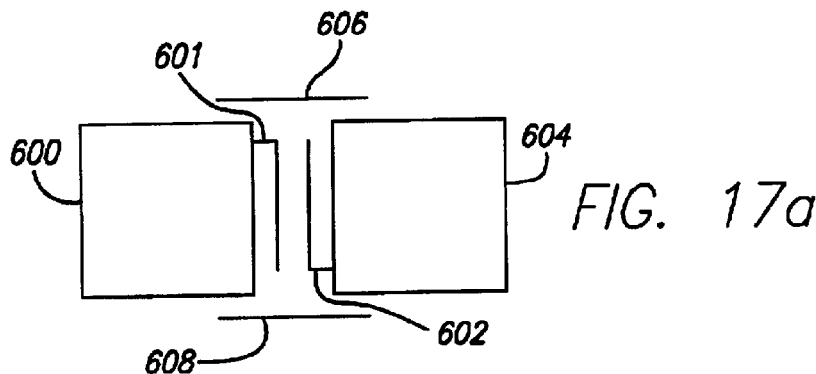
FIGS. 17a, 17b, and 17c illustrate exemplary embodiments of the invention in which two or more integrated circuits are directly electromagnetically coupled.
Figure 17B:
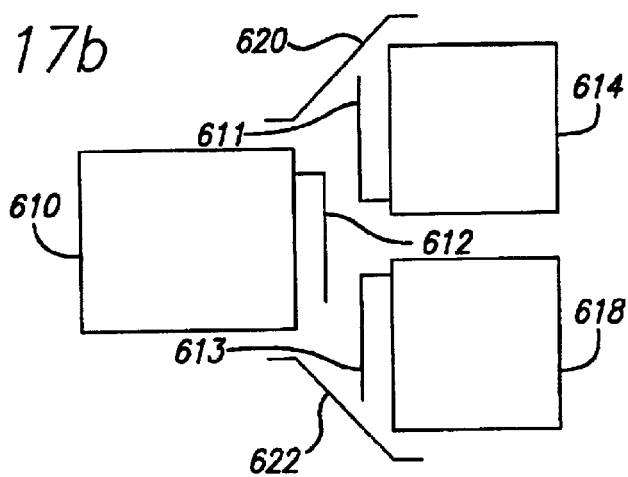
Figure 17C:
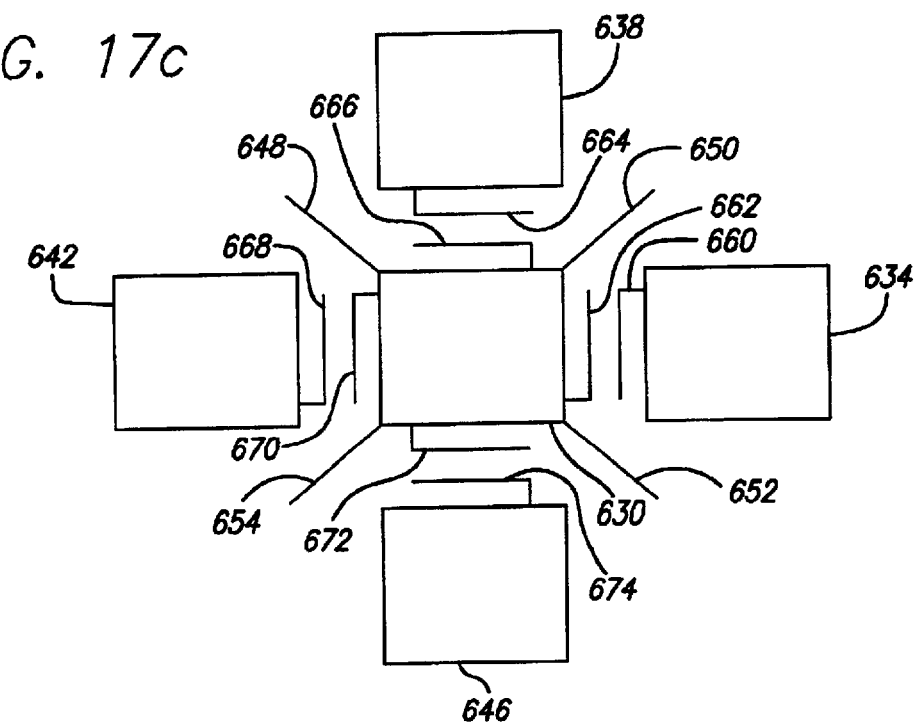

FIGS. 17*a*, 17*b*, and 17*c* illustrate exemplary arrangements in which two or more integrated circuits are arranged with a direct wireless communication path or channel between two or more integrated circuits. The integrated circuits may be mounted on a printed circuit board (not shown) or other substrate or frame suitable for securing integrated circuits. In these exemplary arrangements, an electromagnetic coupler is formed on an outer edge of the integrated circuit. In FIG. 17*a*, integrated circuits 600 and 604 are arranged such that they can wirelessly communicate with each other. In FIG. 17*b*, three integrated circuits 610, 614, 418 are arranged such that each is able to wirelessly communicate with the other. In FIG. 17*c*, one integrated circuit 630 includes four electromagnetic couplers, each arranged to be electromagnetically coupled to one of integrated circuits 634–646.

In accordance with the shielding principles discussed above, shielding materials may optionally be included and disposed so as to fully or partially shield or "close" one or more contactless communications channels between the integrated circuits. For example, shielding material (not shown in FIGS. 17a, 17b, and 17c) may be placed between the electromagnetic couplers 601, 602, 611, 612, 613, 660, 662, 664, 666, 668, 670, 672, 674 (see FIGS. 17a, 17b, and 17c) and circuitry on any of the integrated circuits shown in FIGS. 17a, 17b, and 17c as generally described above. As illustrated in FIG. 17a, shielding planes or traces 606, 608 may also be disposed so as to shield the contactless communication path between two or more coupled electromagnetic couplers 601, 602. Although not shown in FIG. 17a, additional shielding planes or traces may be included above and below (from the perspective of FIG. 17a) integrated circuits 600 and 604 to more fully shield the contactless communication path between couplers 601 and 606. Similarly, shielding material 620, 622 may be disposed to shield the contactless communication paths among couplers 611, 612, 613 in FIG. 17b, and additional shielding (not shown) may be included above and below (from the perspective of FIG. 17b) the integrated circuits 610, 614, 618 to more fully shield the paths. FIG. 17c likewise shows exemplary shielding material 650 shielding the contactless communication path between couplers 660 and 662 from the contactless communication path between couplers 664 and 666. Shielding material 648, 654, 652 similarly shields contactless communication paths between the following pairs of couplers: 668 and 670, 672 and 674, and 650, 652. Additional shielding material (not shown) could be placed above and below (from the perspective of FIG. 17c) the coupling areas between adjacent couplers to more fully shield the contact communication paths.

Although the electromagnetic couplers illustrated in 1, 2, 3, 4, 5, 6a, 6b, 7, 8, 9, 10, 11, 12, 13, 14, 15, 16, 17a, 17b, 17c, 18, and 19 are shown as being formed by straight line conductors, the couplers may be formed by conductors of any other shape including without limitation spirals. Indeed, the shape and size of the electromagnetic couplers can be selected to cause predetermined levels of inductance and capacitance so as to form tuned or resonate circuit or radio-frequency transformer structures. Moreover, as described above with respect to integrated circuits illustrated in FIGS. 1, 2, 3, 4, 5, 6a, 6b, 7, 8, 9, 10, 11, 12, 13, 14, 15, and 16, electromagnetic couplers 601, 602, 611, 612, 613, 660, 662, 664, 666, 668, 670, 672, 674 are preferably formed on or within the integrated circuit using standard semiconductor fabrication techniques. Alternatively, the electromagnetic couplers can be fabricated as part of the semiconductor package.

Figure 18:
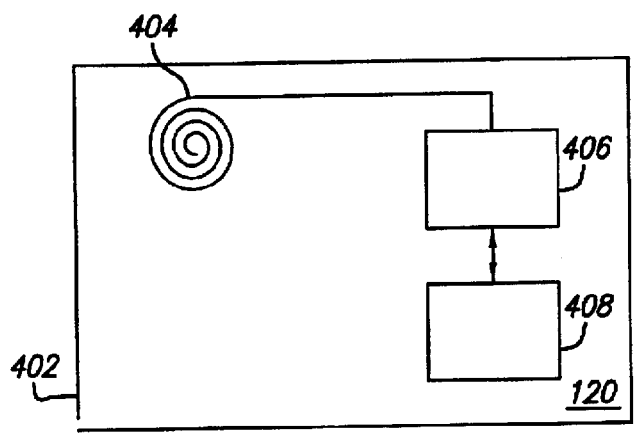
FIG. 18 illustrates an exemplary embodiment of an integrated circuit having a spiral electromagnetic coupler.
Figure 19:
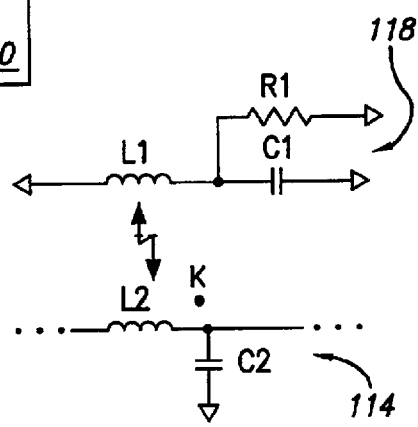
FIG. 19 illustrates an equivalent circuit diagram corresponding to FIG. 18.

FIG. 18 illustrates an exemplary spiral coupler 404 formed on or within a semiconductor substrate 402. Also formed on the substrate is transceiver circuitry 406 and functional circuitry 408, which may be similar to like circuits illustrated in FIGS. 4, 8, and 13. FIG. 19 illustrates a circuit modeling equivalent impedances of the spiral coupler 404 and the transceiver circuitry 406 and a transmission line (not shown in FIG. 18) or like coupler to which the spiral coupler 404 is coupled. In FIG. 19, L1 and C1 represent the inductance and capacitance of spiral conductor 404 and its connection path to transceiver circuitry 406; R1 represents the input or output impedance of the transceiver circuitry 406; and L2 and C2 represent the inductance and capacitance of the transmission line (not shown in FIG. 18) to which the spiral conductor 404 is coupled. (Elements 404 and 406 are shown in FIG. 18.)

The spacing between spiral coupler 404 and the transmission line or like coupler may be selected to provide a link coupling factor k in the range of slightly more than 0.0 to 1.0 Inductances L1 and L2 and capacitances C1 and C2 may be sized to resonate at the frequency $f_c$ of the RF carrier signal as follows:

$$f_c = 1/[2PI(L1C1)^{1/2}] = 1/[2PI(L2C2)^{1/2}] \quad [1]$$

The input impedance R1 of the transceiver to obtain a desired circuit quality factor Q as follows:

$$Q = R1/[(L1C1)^{1/2}] \quad [2]$$

Higher values of Q increase the amount of coupling between the spiral coupler 118 and the transmission line but also decrease RF signal bandwidth. The appropriate choice for Q thus depends on the amount of signal attenuation the transceivers can tolerate.

If tight coupling between electromagnetic couplers is desired, the electromagnetic couplers may be one fourth of the wavelength of the RF signal carrier frequency, thus forming a resonate coupling structure. As noted above, however, if electromagnetic couplers of a large number of integrated circuits are tightly coupled to a transmission line, each electromagnetic coupler draws a substantial amount of power from the radio frequency signal as it travels along the transmission line and the radio frequency signal can become severely attenuated by the time it reaches an integrated circuit at the end of a transmission line. As discussed above, in such a case, it is preferable to size electromagnetic couplers to be less tightly coupled to the transmission line so that they do not draw substantially more power than needed to permit an incoming radio frequency signal to be properly detected by the transceivers. Where only a few integrated circuits are contactlessly connected to each other, it may be advantageous to increase the coupling between integrated circuits to reduce the amount of radio-frequency energy radiated and hence reduce shielding requirements.

While the forgoing specification has described preferred embodiment(s) of the present invention, one skilled in the art may make many modifications to the preferred embodiment without departing from the invention in its broader aspects. For example, it should be understood that invention can be used in combination with conventional data communication techniques. For example, the electronics systems described above may also include integrated circuits and other system elements that communicate conventionally via physical contact. As another example, any of the transceivers described above may be replaced with a circuit that only transmits or only receives as may be appropriate in a given application of the invention. In addition, the input/output interface 15, 64, and 94 in FIGS. 4, 8, and 13, may be configured to communicate with other elements in addition to a transceiver and a logic circuit. Also, in FIG. 3, integrated circuits 14 could be mounted on both sides of the printed circuit board 21, and gaps provided in shielding plane 48 to allow couplers 18 on integrated circuits mounted on the lower (from the perspective of FIG. 3) of printed circuit board 21 to electromagnetically couple with transmission line 22. Similarly, integrated circuits or stacks of integrated circuits could be mounted on both sides of the printed circuit boards shown in FIGS. 10, 14, 15, and 16.

What is claimed is:

1. An electronics system comprising:
   a transmission line;
   an electronic component comprising an electromagnetic coupler electromagnetically coupled to said transmission line; and
   first shielding material disposed to at least partially shield said transmission line,
   wherein said electronic component is an integrated circuit, and
   wherein the electromagnetic coupler of said integrated circuit is integrated with a packaging of said integrated circuit.

2. An electronics system comprising:
   a transmission line; and
   an electronic component comprising an electromagnetic coupler electromagnetically coupled to said transmission line;
   wherein said electromagnetic coupler is loosely coupled to said transmission line such that a signal in said electromagnetic coupler induces a corresponding signal in said transmission line that is attenuated by at least about 10 decibels.

3. The electronics system of claim 2, wherein said electromagnetic coupler is loosely coupled to said transmission line such that a signal in said electromagnetic coupler induces a corresponding signal in said transmission line that is attenuated by at least about 20 decibels.

4. The electronics system of claim 2, wherein said electromagnetic coupler is loosely coupled to said transmission line such that a signal in said electromagnetic coupler induces a corresponding signal in said transmission line that is attenuated by between about 10 decibels and about 40 decibels.

5. The electronics system of claim 2 further comprising first shielding material disposed between circuitry on said electronic component and said electromagnetic coupler.

6. The electronics system of claim 5 further comprising second shielding material disposed to at least partially shield said transmission line.

7. The electronics system of claim 6, wherein said second shielding material comprises a gap through which said electromagnetic coupler of said electronic component electromagnetically couples to said transmission line.

8. The electronics system of claim 5, wherein said first shielding material comprises a gap disposed adjacent the electromagnetic coupler of said electronic component.

9. The electronics system of claim 2 further comprising a plurality of said electronic components, each said electronic component comprising a respective electromagnetic coupler electromagnetically coupling said corresponding electronic component to said transmission line.

10. The electronics system of claim 9, wherein said plurality of electronic components are disposed along said transmission line such that the electromagnetic couplers of each of said electronic components are spaced no more than about ten millimeters from said transmission line.

11. The electronics system of claim 9, wherein each of said electromagnetic couplers is grounded at one end.

12. The electronics system of claim 9, wherein at least two of said plurality of electronic components are integrated circuits.

13. The electronics system of claim 12 further comprising a substrate, wherein said transmission line comprises a conductive material disposed on said substrate and each of said integrated circuits is attached to said substrate.

14. The electronics system of claim 2, wherein said electronic component is a first circuit board.

15. The electronics system of claim 14, wherein said transmission line is disposed on a second circuit board.

16. The electronics system of claim 2, wherein said transmission line does not physically contact an active electronic device.

17. The electronics system of claim 2, wherein said transmission line is driven only by electronic devices that are electromagnetically coupled to said transmission line.

18. The electronics system of claim 2 further comprising a plurality of said transmission lines.

19. The electronics system of claim 18, wherein said electronic component comprises a plurality of said electromagnetic couplers.

20. The electronics system of claim 19, wherein each said electromagnetic coupler is electromagnetically coupled to a corresponding one of said plurality of transmission lines.

21. The electronics system of claim 18 further comprising shielding material disposed between each of said plurality of transmission lines.

22. The electronic system of claim 2 further comprising an integrated circuit to which said electromagnetic coupler is connected, and wherein said electromagnetic coupler is smaller than said integrated circuit.

23. The electronics system of claim 2, wherein said transmission line is passive.

24. An electronics system comprising:
   a transmission line; and
   a plurality of integrated circuits, each integrated circuit comprising a respective electromagnetic coupler electromagnetically coupled to said transmission line,
   wherein each said electromagnetic coupler is loosely coupled to said transmission line such that a signal in each said electromagnetic coupler induces a corresponding signal in said transmission line that is attenuated by at least about 10 decibels, and
   wherein each said electromagnetic coupler of each said integrated circuit is smaller than each said integrated circuit.

25. An electronics system comprising:
   a transmission line;
   shielding means for shielding said transmission line;
   a plurality of electronic components; and
   a plurality of coupling means, each coupling means for electromagnetically coupling at least one of said electronic components with said transmission line,
   wherein each of said plurality of coupling means couples one of said electronic components with said transmission line loosely with at least a 10 decibel attenuation.

26. The electronics system of claim 25, wherein said transmission line is disposed on a substrate, and said plurality of electronic components comprise respective integrated circuits disposed on said substrate.

27. An electronics system comprising:
   a transmission line; and
   an electronic component comprising an electromagnetic coupler electromagnetically coupled to said transmission line;
   wherein said electromagnetic coupler is smaller than said electronic component and loosely coupled to said transmission line such that a signal in said transmission line induces a corresponding signal in said electromagnetic coupler that is attenuated by at least about 10 decibels.

28. The electronics system of claim 27 further comprising first shielding material disposed to at least partially shield said transmission line.

29. The electronics system of claim 28, wherein said first shielding material is disposed between said transmission line and said electronic component and comprises a gap through which said electromagnetic coupler of said electronic component electromagnetically couples to said transmission line.

30. The electronics system of claim 27 further comprising a plurality of said transmission lines.

31. The electronics system of claim 30, wherein said electronic component comprises a plurality of electromagnetic couplers.

32. The electronics system of claim 31, wherein each said electromagnetic coupler is electromagnetically coupled to a corresponding one of said plurality of transmission lines.

33. The electronics system of claim 32 further comprising shielding material disposed between each of said plurality of transmission lines.

34. The electronics system of claim 27 further comprising a plurality of said electronic components, each said electronic component comprising a respective electromagnetic coupler electromagnetically coupling said corresponding electronic component to said transmission line.

35. The electronics system of claim 27, wherein said electronic component is an integrated circuit.

36. The electronics system of claim 27, wherein said electromagnetic coupler is loosely coupled to said transmission line such that a signal in said r transmission line induces a corresponding signal in said electromagnet coupler that is attenuated by at least about 20 decibels.

37. The electronics system of claim 27, wherein said electromagnetic coupler is loosely coupled to said transmission line such that a signal in said transmission line induces a corresponding signal in said electromagnetic coupler that is attenuated by between about 10 decibels and about 40 decibels.

38. An electronics system comprising:

a transmission line;

a plurality of electronic components;

shielding means associated with each of said electronics components for shielding each said electronic component; and a plurality of coupling means, each coupling means for electromagnetically coupling at least one of said electronic components with said transmission line, wherein a respective one of said plurality of coupling means couples a corresponding one of said electronic components with said transmission line loosely with at least a 10 decibel attenuation.

39. The electronics system of claim 38, wherein said transmission line is disposed on a substrate, and said plurality of electronic components comprise respective integrated circuits disposed on said substrate.

40. An electronics system comprising:

a transmission line;

an electronic component comprising an electromagnetic coupler electromagnetically coupled to said transmission line; and first shielding material disposed between circuitry on said electronic component and said electromagnetic coupler, wherein said electronic component is an integrated circuit, and wherein the electromagnetic coupler of said integrated circuit is integrated with a packaging of said integrated circuit.

41. An electronics system comprising:

a transmission line;

an electronic component comprising an electromagnetic coupler electromagnetically coupled to said transmission line; and first shielding material disposed between circuitry on said electronic component and said electromagnetic coupler, wherein said electromagnetic coupler is grounded at one end.

* * * * *